United States Patent
Gollentz

(10) Patent No.: US 8,354,811 B2
(45) Date of Patent: Jan. 15, 2013

(54) SWITCHING CIRCUIT FOR SERIES CONFIGURATION OF IGBT TRANSISTORS

(75) Inventor: Bernard Gollentz, Soultz (FR)

(73) Assignee: Converteam SAS, Massy (FR)

( * ) Notice: Subject to any disclaimer, the term of this patent is extended or adjusted under 35 U.S.C. 154(b) by 576 days.

(21) Appl. No.: 12/297,774

(22) PCT Filed: Apr. 19, 2007

(86) PCT No.: PCT/FR2007/000659
§ 371 (c)(1),
(2), (4) Date: Jul. 17, 2009

(87) PCT Pub. No.: WO2007/122322
PCT Pub. Date: Nov. 1, 2007

(65) Prior Publication Data
US 2011/0204835 A1   Aug. 25, 2011

(30) Foreign Application Priority Data
Apr. 20, 2006 (FR) ...................... 06 03516

(51) Int. Cl.
H02P 6/14 (2006.01)
H02P 25/08 (2006.01)
(52) U.S. Cl. ................ 318/400.27; 318/254.2
(58) Field of Classification Search ........... 318/254.1, 318/254.2, 294, 400.27, 400.29
See application file for complete search history.

(56) References Cited

U.S. PATENT DOCUMENTS

| 4,492,881 | A | * | 1/1985 | Anderson et al. | ........... 326/89 |
|---|---|---|---|---|---|
| 5,566,063 | A | | 10/1996 | Gerster et al. | |
| 2006/0202636 | A1 | * | 9/2006 | Schneider | ........... 315/291 |
| 2006/0203399 | A1 | * | 9/2006 | Faccin | ........... 361/15 |

FOREIGN PATENT DOCUMENTS

| DE | 1 413 526 | 1/1969 |
|---|---|---|
| DE | 43 35 857 | 4/1995 |
| EP | 0 458 511 | 11/1991 |

OTHER PUBLICATIONS

M. Melito et al., "Switching Balancement of Series Connected Insulated Gate Devices by Gate Control Strategy", EPE '97. 7th European Conference on Power Electronics and Applications, Sep. 8, 1997, pp. 4034-4038, vol. 4, Conf. 7, Trondheim, Brussels, Belgium.
Beom-Seok Seo et al., "Synchronization on the Points of Turn-Off Time of Series-Connected Power Semiconductor Devices Using Miller Effect", Signal Processing and Systems Control, Intelligent Sensors and Instrumentation, Proceedings of the International Conference on Industrial Electronics, Control, Instrumentation and Automation, Nov. 9, 1992, pp. 325-329, vol. 3, Conf. 18, IEEE, New York, NY, US.

* cited by examiner

*Primary Examiner* — Derek Rosenau
(74) *Attorney, Agent, or Firm* — Young & Thompson

(57) ABSTRACT

A switching circuit includes two power transistors (22, 24) connected in series and a circuit (26, 28) for exciting each transistor suitable for simultaneously switching the two transistors. The circuit includes elements (30) for generating a corrective current ($\delta i$) for controlling a corrected-control transistor (22) among the two transistors (22, 24) according to the difference in temporal variation of the voltage at the conduction terminals of the two series-connected transistors (22, 24), and elements (37) for applying the current to the gate electrode of the corrected-control transistor (22).

11 Claims, 4 Drawing Sheets

SWITCHING CIRCUIT FOR SERIES CONFIGURATION OF IGBT TRANSISTORS

The present invention relates to a switching circuit of the type comprising two power transistors which are mounted in series and, for each transistor, an excitation circuit which is capable of achieving simultaneous switching of the two transistors.

AC motors are commonly supplied with electrical power from a DC supply bus, to the terminals of which there are connected the different phases of the motors via a frequency variator which is constituted by switching members whose state is controlled by an appropriate electronic control unit.

Such electronic control units are discussed, for example, in documents EP 0458511 and DE 1413526.

For very powerful pump or compressor drive motors, in particular for petroleum use, very high levels of electrical power must flow through the switching members which provide the electrical power supply of the motor.

The members are constituted by transistors of the IGBT type. In order to produce frequency variators for very powerful motors, it is advantageous to mount in series two transistors of the IGBT type in order to bring about each switching operation, a single transistor not allowing the flow of the current to be interrupted for very high voltages at these terminals.

The two transistors which are thus connected in series must be controlled with complete synchronisation so that they correspond to a single transistor in terms of function. Synchronisation errors between the two transistors lead to the voltage being supported by only one of the transistors, which may bring about the destruction thereof.

Taking into account the production tolerances of transistors and the precision of the electronic control system, the synchronisation of the operation of the transistors is complex to implement. Very sophisticated electronic control solutions have been developed. These solutions require the use of specific integrated circuits which are very costly.

Furthermore, a technique is known for protecting transistors which is commonly referred to as "active clamping".

According to this solution, the transistors are associated between the control grid and a conduction terminal with a Zener diode with a resistor which is mounted in an inverted state and which, when the voltage between the conduction terminals of the transistor is too high, allows the transistor to be returned to its conductive state and thus the voltage at its terminals to be limited.

This technique requires very high ignition margins for the transistors and involves the use of Zener diodes which are resistant and relatively precise.

Solutions to these difficulties have already been proposed.

For example, in document DE 43 35 857, a corrective signal is generated and commands a delay in the switching operation of one of the transistors. This document forms the subject-matter of the pre-characterising clause of claim 1.

The article MELITO, "SWITCHING BALANCEMENT OF SERIES CONNECTED INSULATE GATE DEVICES BY GATE CONTROL STRATEGY", EPE'97, 7TH EUROPEAN CONFERENCE ON POWER ELECTRONICS AND APPLICATIONS, TRONDHEIM, SEPT. 8-10, 1997 describes an arrangement in which the control circuit of one of the transistors in series is replaced by an arrangement having a current generator and current sink.

In the document BEOM-SEOK, "SYNCHRONISATION ON THE POINTS OF TURN-OFF TIME OF SERIES-CONNECTED POWER SEMICONDUCTOR DEVICES USING MILLER EFFECT", SIGNAL PROCESSING AND SYSTEM CONTROL, INTELLIGENT SENSORS AND INSTRUMENTATION, SAN DIEGO, NOV. 9-13, 1992, a damping circuit is used in order to command the control circuits of the transistors.

In these documents, the corrective signals are always applied to the control circuits of the transistors and not to the transistors themselves. Complex arrangements result and consequently have the disadvantage of relatively significant time constants.

The object of the invention is to provide an inexpensive solution to the problem of synchronising two transistors which are mounted in series.

To this end, the invention first relates to a switching circuit of the above-mentioned type, characterised in that it comprises means for producing a corrective current for controlling one corrected control transistor from the two transistors, in accordance with the difference in the temporal development of the voltage at the conduction terminals of the two transistors which are mounted in series, and means for applying the current to the grid electrode of the corrected control transistor.

In this manner, in the invention, the corrective current acts on the internal operation of the transistor which is further controlled by a conventional control system.

According to specific embodiments, the switching circuit comprises one or more of the following features:

the circuit comprises two capacitors which are connected to the conduction terminals of the two transistors and which are connected to means for evaluating the difference in the temporal development of the voltage at the conduction terminals of the two transistors which are mounted in series;

at least one capacitor is mounted in series with a resistor;

the two capacitors are connected in series at outer conduction terminals of the two transistors, and the means for establishing the difference in the temporal development of the voltage at the conduction terminals of the two transistors which are mounted in series comprise means for measuring the corrective control current, at the centre point of the two capacitors;

a first capacitor is connected between the outer conduction terminals of the two transistors and the second capacitor is connected between the conduction terminals of one of the transistors and the means for establishing the difference in the temporal development of the voltage at the conduction terminals of the two transistors which are mounted in series comprise analogue means for calculating the difference in the temporal development of the voltage at the conduction terminals of the two transistors which are mounted in series from the voltages at the terminals of the two capacitors;

the circuit comprises means for applying the corrective control current directly to the grid electrode of the corrected control transistor;

the circuit comprises means for adding the corrective control current to the control signal produced by the excitation circuit of the corrected control transistor; and the circuit comprises, at least at the grid of a transistor, a circuit for inhibiting the corrective current applied to the corrected control transistor in order to inhibit the correction during a short-circuit of the other transistor.

The invention also relates to a frequency variator for an AC motor which comprises at least one switching circuit as described above.

The invention will be better understood from a reading of the following description, given purely by way of example and with reference to the drawings, in which.

Figure 1:
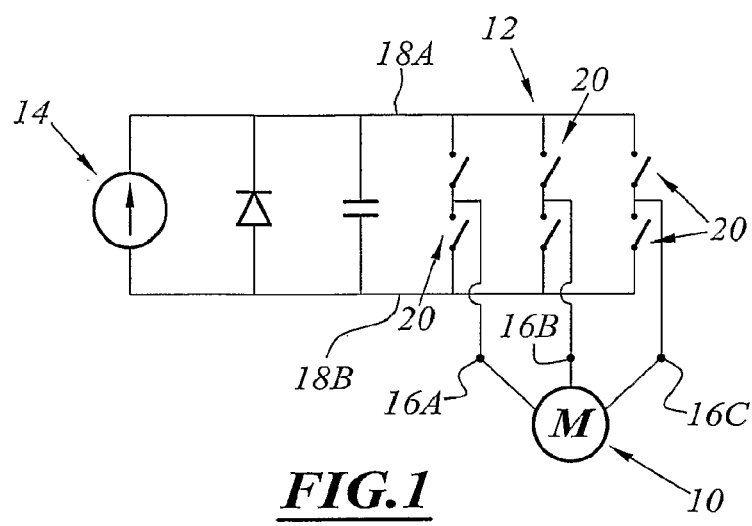
FIG. 1 is a schematic view of a speed variator which supplies an AC motor with electrical power.

In FIG. 1, an AC motor 10 is supplied with electrical power by a speed variator 12 as illustrated. This variator is connected to a DC supply bus 14. For example, three poles 16A, 16B, 16C of the motor are each connected to a terminal 18A, 18B of the DC supply bus by a switching circuit 20. In this manner, six switching circuits 20 are operated, each between a phase of the motor and a terminal of the bus. Each switching circuit is controlled by a control circuit which is not illustrated.

Figure 2:
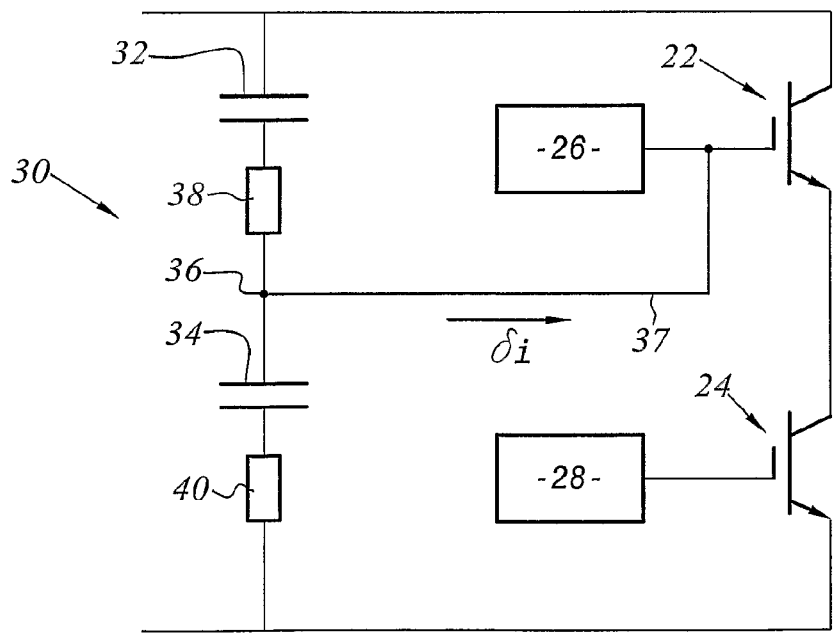
FIG. 2 is a diagram of a switching circuit of the variator of FIG. 1.

One of the switching circuits 20 is illustrated in detail in FIG. 2. It comprises two transistors 22, 24 of the IGBT type which are connected in series between a terminal of the bus and a phase of the motor. The grid electrode of each transistor is connected to an excitation circuit 26, 28, respectively, which is known per se.

Furthermore, the switching circuit 20 comprises means 30 for producing a corrective signal, in this instance, according to the invention, a current δi, for controlling one corrected control transistor from the two transistors 22, 24 in accordance with the difference in the temporal development of the voltage at the conduction terminals of the two transistors which are mounted in series.

In the embodiment illustrated in FIG. 2, the corrected control transistor is the transistor 22.

The means 30 for producing the corrective signal comprise in this instance two capacitors 32, 34 which are mounted in series between the outer conduction terminals of the two transistors 22, 24.

The central point 36 of the two capacitors is connected to the grid of the corrected control capacitor 22 by a conductor 37 for injecting a correction current.

According to one advantageous embodiment, and as illustrated in FIG. 2, each capacitor 32, 34 is associated in series with a resistor 38, 40, which improves the operating stability.

The capacitors are identical and have, for example, a capacitance of between 100 pF and 10 nF. In the same manner, the two resistors are identical and have a resistance of between 1Ω and 100 Ω.

The result of the connections of the circuit illustrated in FIG. 2 is that the current δi which is injected from the centre point 36 of the two capacitors towards the grid of the corrected control transistor 22 and which corresponds to the corrective signal is equal to $$\delta i = C \frac{d}{dt}(V_{32} - V_{34})$$

where $V_{32}$ and $V_{34}$ are the voltages at the terminals of the capacitors 32, 34, C is the capacitance of the two capacitors; and $$\frac{d}{dt}$$

designates the derivative with respect to time.

In this manner, during operation, when there is a difference between the derivatives of the voltage with respect to time at the terminals of the two transistors 22, 24, asymmetry appears during switching in the charging or discharging of the capacitors. In this manner, a current δi is produced and is reinjected into the grid of the corrected control transistor 22, thereby correcting the current which passes through it and modifying in a correlative manner the charge of the capacitor which is mounted in parallel.

Figure 3:
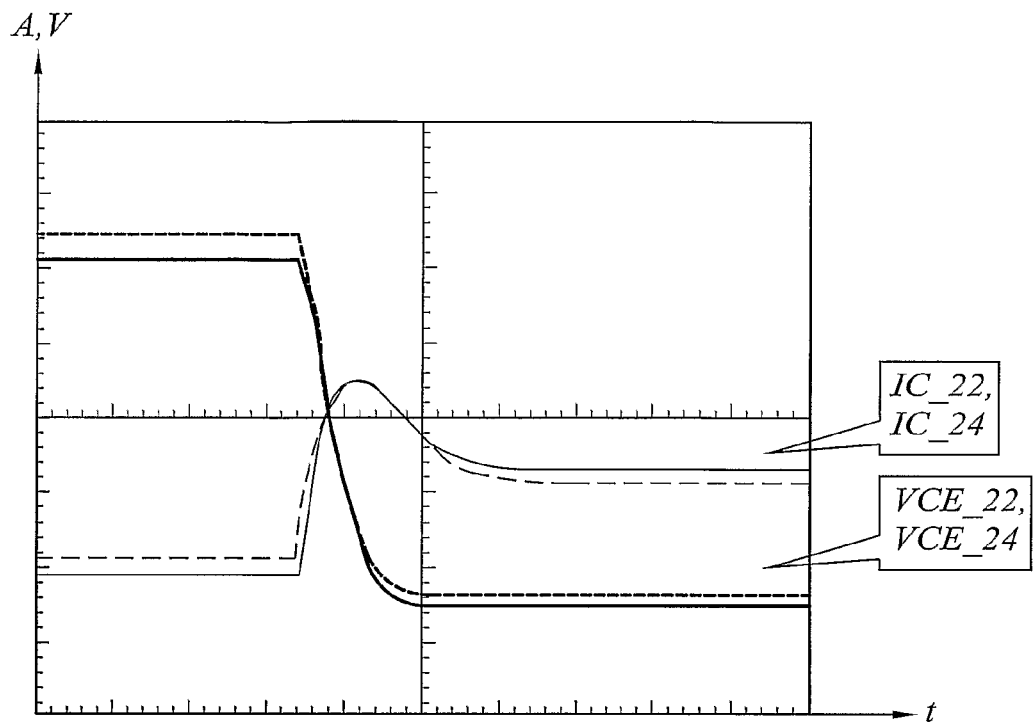
FIGS. 3 and 4 are lines illustrating the operation of the switching circuit of FIG. 2.
Figure 4:
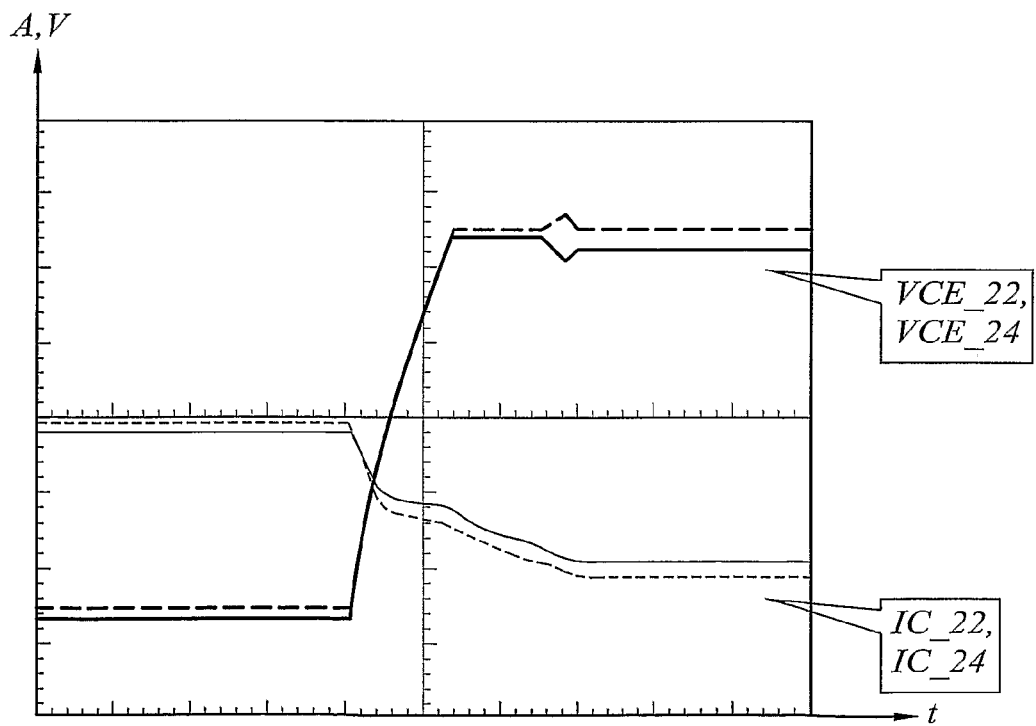

One example is illustrated in FIGS. 3 and 4 showing the switching of a switching circuit to the conductive state and to the blocked state, respectively.

It can be seen in these two Figures that the voltages at the terminals of the two transistors illustrated with a continuous solid line for the transistor 22 and with long dashed lines for the transistor 24 decrease or increase but remain substantially equal for the entire phase of flow or interruption of the current. The current, which is illustrated with short dashed lines for the transistor 22 and with a thin continuous line for the transistor 24, passes from a minimum value to a higher stationary value after passing via an extreme value or from a stationary value to a lower value. Since the two transistors are in series, the flowing currents are substantially identical.

In this manner, a simple passive circuit is provided which allows the switching of the corrected control transistor to be accelerated or slowed down in order to establish, in a forced manner, a distribution of the voltage between the two transistors during switching.

Figure 5:
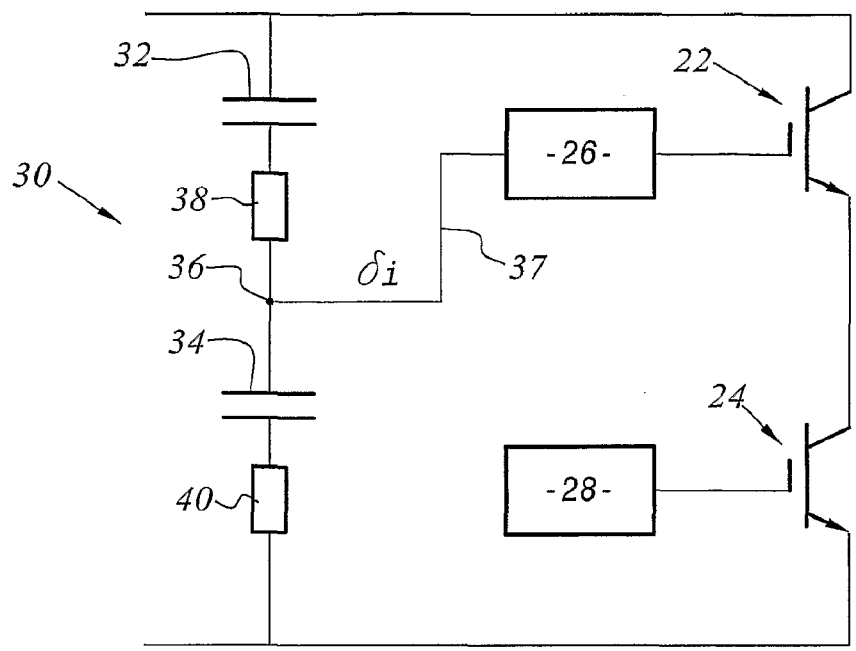
FIGS. 5, 6 and 7 are diagrams of construction variants of a switching circuit according to the invention.

According to another variant which is illustrated in FIG. 5, the corrective current δi is introduced into the excitation circuit 26 of the corrected control transistor 22 and is not applied directly to the grid of the corrected control transistor 22.

In this embodiment, the excitation circuit 26 is capable of modifying the excitation signal sent to the grid of the corrected control transistor in accordance with the corrective current δi received. In particular, the corrective current received is filtered and amplified, in order to be added to the control signal produced as known per se by the excitation circuit 26.

Figure 6:
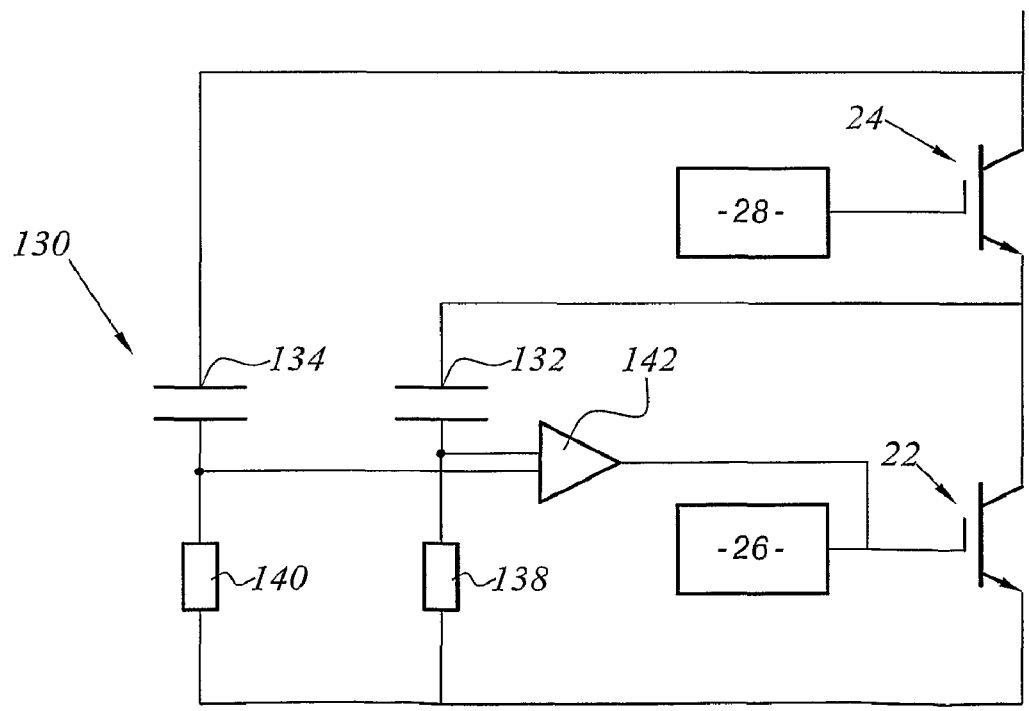

Another embodiment of a switching circuit is illustrated in FIG. 6 which shows the two transistors 22, 24 which are mounted in series and which are each associated with an excitation circuit 26, 28, respectively.

In this embodiment, the corrected control transistor 22 is connected to the source of the transistor 24, that is to say that the transistors are transposed with respect to the embodiment of FIGS. 1 to 5.

Means 130 for producing a corrective control current δi for the transistor 22 are also provided.

They comprise a capacitor 132 which is mounted between the two conduction terminals of the corrected control transistor 22 and a second capacitor 134 which is mounted in parallel between the outer conducting terminals of the two transistors 22, 24.

Each capacitor 132, 134 is mounted in series with a resistor 138, 140. These resistors are connected between the collectors of the transistors 22 and 24 and a plate of the corresponding capacitor.

Each plate of the capacitors 132, 134 that is connected to a resistor 138, 140 is connected to the input of an analog calculator 142 which is capable of establishing a linear combination between the signals received at the input.

The output of the calculator 142 is directly connected to the grid of the corrected control transistor 22. In a variant, this output is connected to the excitation circuit 26.

The calculator 142 is capable of calculating a correction current $$\delta i = C \frac{d}{dt}(V_{132} - V_{134})$$

with the value of the resistors 138, 140 being disregarded.

It will be appreciated that, also in this embodiment, the control signal of the transistor 22 is modified in accordance with the voltages at the terminals of the two capacitors 132, 134. These voltages are directly connected to the voltages at the terminals of the transistors 22, 24. In this manner, in the event of a difference in the voltages at the terminals of the transistors, a comparable difference is found at the terminals of the capacitors and a corrective current representing this difference is applied to the transistor 22, thus correcting the voltage difference at the terminals of the transistors.

Figure 7:
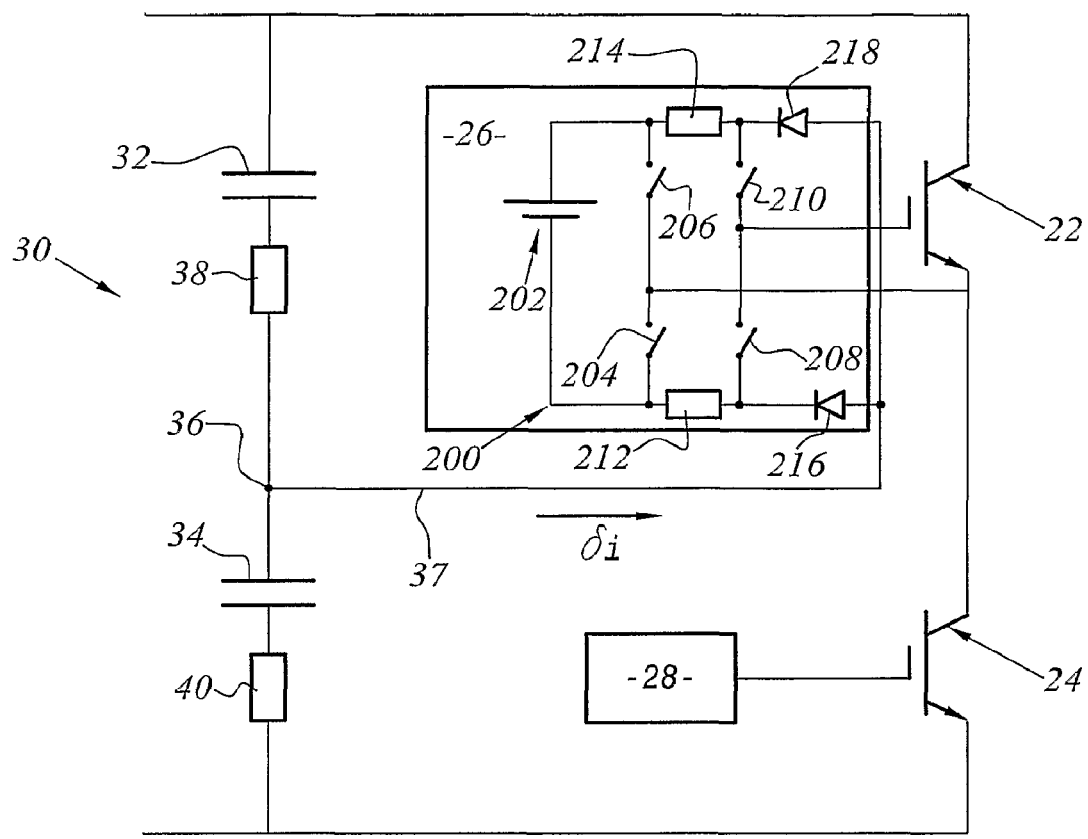

FIG. 7 illustrates an improvement of the embodiment of FIG. 1.

In this manner, elements which are identical are given the same reference numerals.

This embodiment comprises an intermediate stage 200 for inhibiting the corrective current which allows redundancy of the IGBT transistors and operation of the switching circuit when one of the IGBT transistors is defective and is blocked in the conductive state.

In particular, this stage 200 is interposed between the centre point of the two capacitors 32, 34 along the injection line 37 of the correction current and the grid of the corrected control transistor 22.

This device comprises a source 202 of voltage, for example, 15V and four switching control members, each of which is controlled to apply a voltage of greater or less than 15V to the grid of the transistor 22 in order to allow operation to continue.

In this manner, two switching members 204, 206 are connected to the terminals of the voltage source 202 and to the collector of the transistor 22, respectively.

In the same manner, two switching members 208, 210 connect the terminals of the voltage source to the grid of the transistor 22 via two resistors 212, 214. A terminal of each switching member 208, 210 connected to the resistor 212, 214, respectively, is connected to the grid of the transistor 22.

In this manner, the voltage source 202, the switching members 208, 210, 212, 214 and the resistors 212, 214 form the excitation circuit 26 which controls the transistor 22. The excitation circuit 26 is connected to the centre point 36 defined between the two capacitors 32, 34 by two diodes 216, 218.

More precisely, each switching member 208, 210 is connected directly to the centre point 36 via a diode 216, 218 which is connected between a switching member and the associated resistor. The step 200 further comprises a unit (not illustrated) for controlling the switching members 204 to 210.

When the switching circuit is placed in a conductive state, only the switching members 204 and 210 are conductive. The control voltage at the grid is equal to $V_{GE}$=15V and the grid current from the excitation circuit 26 flows through the resistor 214.

When the switching circuit is closed, the transistors 206, 208 are placed in a conductive state. The control voltage at the grid is equal to $V_{GE}$=−15 V and the grid current from the excitation circuit 26 passes through the resistor 212.

The use of the diodes 216, 218 in the δi return circuit ensures that the characteristics for placing the corrected control transistor 22 in a conductive state and opening it are modified only when the corrected control transistor 22 switches more slowly than the associated transistor 24 during normal operation.

If, during a state of malfunction, the transistor 24 is short-circuited, the presence of the diodes 216, 218 allows the switching of the transistor 22 to be decoupled from the effects resulting from the short-circuit established at the terminals of the transistor 24.

In order to compensate, during normal operation, for the fact that the switching of the corrected control transistor 22 cannot be carried out more slowly in order to correspond to that of the transistor 24, the resistors 212 and 214 are selected so that the switching operations of the transistor 24 are more rapid than those of the transistor 22. Alternatively, delays are used in the gates of the corrected control transistor 22 compared with that of the transistor 24 for improved compensation.

The invention claimed is:

1. A switching circuit comprising:
two power transistors (22, 24) which are mounted in series;
an excitation circuit (26, 28) for exciting each transistor to obtain simultaneous switching of the two transistors, the excitation circuit (26, 28) providing turn-on signals at the two power transistors (22, 24) being simultaneous, and turn-off signals at the two power transistors (22, 24) being simultaneous so that the two power transistors (22, 24) simultaneously switch on and the two power transistors simultaneously switch off (22, 24);
means (30) for producing a corrective current (δi) for controlling one corrected control transistor (22) among the two transistors (22, 24), in accordance with the difference in the temporal development of the voltage at the conduction terminals of the two transistors (22, 24) which are mounted in series; and
means (37) for applying the current to the grid electrode of the corrected control transistor (22), the means for applying the current comprising two capacitors (32, 34; 132, 134) which are connected to the conduction terminals of the two transistors (22, 24), the two capacitors (32, 34) being connected in series at outer conduction terminals of the two transistors (22, 24),
wherein the means (30) for producing a corrective current (δi) comprise means (37) for picking the corrective control current (δi), at the center point (36) between the two capacitors (32, 34), the center point being a point on an electrical connector between the series-connected capacitors.

2. The switching circuit according to claim 1, wherein at least one capacitor (32, 34; 132, 134) is mounted in series with a resistor (38, 40; 138, 140).

3. The switching circuit according to claim 1, further comprising:
means (36, 37) for applying the corrective control current (δi) directly to the grid electrode of the corrected control transistor (22).

4. The switching circuit according to claim 2, further comprising:
means (36, 37) for applying the corrective control current (δi) directly to the grid electrode of the corrected control transistor (22).

5. The switching circuit according to claim 1, further comprising:
means (37) for adding the corrective control current (δi) to the turn-on signals and the turn-off signals produced by the excitation circuit (26) of the corrected control transistor.

6. The switching circuit according to claim 1, further comprising:
- at least at the grid of a transistor (22), a circuit (200) for inhibiting the corrective current (δi) applied to the corrected control transistor (22) in order to inhibit the correction during a short-circuit of the other transistor (24).

7. A frequency variator for an AC motor which comprises at least one switching circuit according to claim 1.

8. The switching circuit according to claim 2, further comprising:
- means (37) for adding the corrective control current (δi) to the turn-on signals and the turn-off signals produced by the excitation circuit (26) of the corrected control transistor.

9. The switching circuit according to claim 2, further comprising:
- at least at the grid of a transistor (22), a circuit (200) for inhibiting the corrective current (δi) applied to the corrected control transistor (22) in order to inhibit the correction during a short-circuit of the other transistor (24).

10. The switching circuit according to claim 3, further comprising:
- means (37) for adding the corrective control current (δi) to the turn-on signals and the turn-off signals produced by the excitation circuit (26) of the corrected control transistor.

11. The switching circuit according to claim 3, further comprising:
- at least at the grid of a transistor (22), a circuit (200) for inhibiting the corrective current (δi) applied to the corrected control transistor (22) in order to inhibit the correction during a short-circuit of the other transistor (24).

* * * * *

UNITED STATES PATENT AND TRADEMARK OFFICE
CERTIFICATE OF CORRECTION

PATENT NO. : 8,354,811 B2
APPLICATION NO. : 12/297774
DATED : January 15, 2013
INVENTOR(S) : Bernard Gollentz Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 945 days.

Signed and Sealed this

First Day of September, 2015

Michelle K. Lee
*Director of the United States Patent and Trademark Office*